(12) United States Patent
Hayashi et al.

(10) Patent No.: US 11,742,392 B2
(45) Date of Patent: Aug. 29, 2023

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Shingo Hayashi, Matsumoto (JP); Takumi Fujimoto, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/358,862

(22) Filed: Jun. 25, 2021

(65) Prior Publication Data
US 2022/0069087 A1   Mar. 3, 2022

(30) Foreign Application Priority Data

Aug. 27, 2020   (JP) .................. 2020-143180

(51) Int. Cl.
*H01L 29/16*   (2006.01)
*H01L 29/78*   (2006.01)
*H01L 29/66*   (2006.01)

(52) U.S. Cl.
CPC .... *H01L 29/1608* (2013.01); *H01L 29/66734* (2013.01); *H01L 29/7805* (2013.01); *H01L 29/7813* (2013.01)

(58) Field of Classification Search
CPC .......... H01L 29/1608; H01L 29/66734; H01L 29/7805; H01L 29/7813; H01L 29/0623;
(Continued)

(56) References Cited

U.S. PATENT DOCUMENTS 9,882,037 B2 *  1/2018  Kono .................. H01L 27/0635
2018/0082841 A1  3/2018  Tawara
(Continued)

FOREIGN PATENT DOCUMENTS

JP   2019-102493 A   6/2019
JP   6627938 B2   1/2020

*Primary Examiner* — Cuong B Nguyen
(74) *Attorney, Agent, or Firm* — Rabin & Berdo, P.C.

(57) ABSTRACT

A silicon carbide semiconductor device, including a semiconductor substrate, a first semiconductor layer provided on a first surface of the semiconductor substrate, a second semiconductor layer provided on a first surface of the first semiconductor layer, a third semiconductor layer provided on a first surface of the second semiconductor layer, a fourth semiconductor layer provided on a first surface of the third semiconductor layer, a plurality of first semiconductor regions of selectively provided in the fourth semiconductor layer at a first surface thereof, a gate electrode provided via a gate insulating film in the fourth semiconductor layer, between the first semiconductor regions and the third semiconductor layer, a first electrode provided on the first surface of the fourth semiconductor layer and surfaces of the first semiconductor regions, and a second electrode provided on a second surface of the semiconductor substrate. Protons are introduced into the second semiconductor layer and have a concentration of $1.0\times10^{13}/cm^3$ to $1.0\times10^{14}/cm^3$.

8 Claims, 7 Drawing Sheets

(58) Field of Classification Search
CPC . H01L 29/0878; H01L 29/1095; H01L 29/36; H01L 29/66068; H01L 29/66325–66348; H01L 29/7393–7398; H01L 29/083–0839
See application file for complete search history.

(56) References Cited

U.S. PATENT DOCUMENTS

2019/0165102 A1    5/2019  Fujimoto
2022/0069087 A1*  3/2022  Hayashi .............. H01L 29/0623

* cited by examiner

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2020-143180, filed on Aug. 27, 2020, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide (SiC) is expected to replace silicon (Si) as a next generation semiconductor material. Compared to a conventional semiconductor device in which silicon is used as a semiconductor material, a semiconductor device in which silicon carbide is used as a semiconductor material (hereinafter, silicon carbide semiconductor device) has various advantages as such as enabling use under higher temperature environments (at least 200 degrees C.) and reducing device resistance in an ON state to one of a few hundredths of that of the conventional semiconductor device. These advantages are due to characteristics of the material itself such as the bandgap of silicon carbide being about three times that of silicon and dielectric breakdown electric field strength being nearly ten times greater than that of silicon.

As silicon carbide semiconductor devices, Schottky barrier diodes (SBDs) and vertical metal oxide semiconductor field effect transistors (MOSFETs) having a planar gate structure or a trench gate structure have been made into products.

A planar gate structure is a MOS gate structure in which a MOS gate is provided in a flat plate-like shape on the front surface of a semiconductor substrate. A trench gate structure is a MOS gate structure in which a MOS gate is embedded in a trench formed in a semiconductor substrate (semiconductor chip) at a front surface of the semiconductor substrate and in which a channel (inversion layer) is formed along sidewalls of the trench, in a direction orthogonal to the front surface of the semiconductor substrate. Therefore, compared to a planar gate structure in which a channel is formed along the front surface of the semiconductor substrate, unit cell (constituent unit of a device element) density per unit area may be increased and current density per unit area may be increased, which is advantageous in terms of cost.

FIG. 9 is a cross-sectional view of a trench gate structure of a conventional silicon carbide semiconductor device. A structure of the conventional silicon carbide semiconductor device is described taking a trench-type MOSFET 170 as an example. In the trench gate structure, an $n^-$-type silicon carbide epitaxial layer 102 is deposited on a front surface of an $n^+$-type silicon carbide substrate 101. At a first surface of the $n^-$-type silicon carbide epitaxial layer 102 opposite to a second surface thereof facing the $n^+$-type silicon carbide substrate 101, an n-type high-concentration region 105 is provided. In the n-type high-concentration region 105, a first $p^+$-type base region 104 is selectively provided so as to underlie an entire area of a bottom of trench 116. Beneath each second $p^+$-type base region 103, an $n^+$-type region 117 is provided.

MOS gates of the trench gate structure are configured by a p-type base layer 106, $n^+$-type source regions 107, $p^+$-type contact regions 108, the trench 116, a gate insulating film 109, and a gate electrode 110. The $p^+$-type contact regions 108 may be omitted.

Further, on the gate electrode 110, an interlayer insulating film 111 is provided, and a source electrode 112 in contact with the $n^+$-type source regions 107 and the $p^+$-type contact regions 108 via openings of the interlayer insulating film 111 is provided. On a back surface of the $n^+$-type silicon carbide substrate 101, a back electrode 113 that is a drain electrode is provided.

A vertical MOSFET having such a structure has, as a body diode between a source and a drain, a parasitic pn diode that is formed by the p-type base layer 106 and the $n^-$-type silicon carbide epitaxial layer 102. The parasitic pn diode may be caused to operate by an application of a high potential to the source electrode 112; and current flows in a direction from the $p^+$-type contact regions 108, through the p-type base layer 106 and the $n^-$-type silicon carbide epitaxial layer 102, to the $n^+$-type silicon carbide substrate 101. In this manner, in the MOSFET, unlike an IGBT, the parasitic pn diode is built-in and therefore, a freewheeling diode (FWD) used in inverters may be omitted, contributing to cost reductions and size reductions. Hereinafter, the parasitic pn diode of the MOSFET is referred to as "built-in diode".

Here, holes (positive holes) that are minority carriers are present in the $p^+$-type contact regions 108, and electrons are present in the $n^+$-type silicon carbide substrate 101 and the $n^-$-type silicon carbide epitaxial layer 102. Therefore, when current flows in the built-in diode, holes from the $p^+$-type contact regions 108 are injected, and in the $n^-$-type silicon carbide epitaxial layer 102 or the $n^+$-type silicon carbide substrate 101, recombination of the electrons and the holes occurs. At this time, when there are defects in the crystals of the $n^+$-type silicon carbide substrate 101, due to generated recombination energy (3 eV) equivalent to the bandgap, basal plane dislocations (BPDs), which are one type of crystal defect present in the $n^+$-type silicon carbide substrate 101, move and single Shockley stacking faults (1SSFs) sandwiched between two basal plane dislocations expand.

When stacking faults expand, the stacking faults do not easily pass current and therefore, ON resistance of the MOSFET and forward voltage of the built-in diode increases. When such operation continues, expansion of the stacking faults is cumulative and therefore, loss occurring with an inverter circuit increases over time and an amount of generated heat also increases, possibly causing device failure.

Therefore, as depicted in FIG. 9, between the $n^-$-type silicon carbide epitaxial layer 102 and the $n^+$-type silicon carbide substrate 101, an n-type border layer 120 and a high-concentration n-type buffer layer 121 are provided. A highly doped layer such as the high-concentration n-type buffer layer 121 doped with a high concentration of, for example, nitrogen (N) is formed, whereby lifetime killers are introduced, recombination of holes from the $n^-$-type silicon carbide epitaxial layer 102 is encouraged and hole concentration reaching the $n^+$-type silicon carbide substrate 101 is controlled, thereby suppressing the occurrence of stacking faults and expansion of the area thereof. Further, the n-type border layer 120 is doped with, for example, nitrogen and has an impurity concentration lower than that of the n+-type silicon carbide substrate 101. The n-type border layer 120 is provided to prevent the crystal defects of the n+-type silicon carbide substrate 101 from being transmitted to the n−-type silicon carbide epitaxial layer 102.

Further, a silicon carbide semiconductor device is commonly known in which protons are implanted as lifetime killers near an interface between a semiconductor substrate of a first conductivity type and a first semiconductor layer of the first conductivity type, thereby reducing the hole density of the interface between the semiconductor substrate of the first conductivity type and the first semiconductor layer of the first conductivity type, and suppressing growth of the crystal defects (refer to Japanese Laid-Open Patent Publication No. 2019-102493).

Further, a silicon carbide semiconductor device is known that has an impurity concentration in a range from $1\times10^{17}/cm^3$ to $1\times10^{18}/cm^3$, a silicon carbide epitaxial layer of the first conductivity type with a film thickness in a range from 1 µm to 5 µm, and a silicon carbide buffer layer of the first conductivity type with an impurity concentration that is at least three times an impurity concentration of the silicon carbide epitaxial layer, the silicon carbide semiconductor device being able to suppress stacking faults by the impurity concentration and thickness of the silicon carbide buffer layer (refer to Japanese Patent No. 6627938).

SUMMARY OF THE INVENTION

According to an embodiment of the present invention, a silicon carbide semiconductor device includes a silicon carbide semiconductor substrate of a first conductivity type, having a first surface and a second surface opposite to each other; a first semiconductor layer of the first conductivity type, provided on the first surface of the silicon carbide semiconductor substrate, and having an impurity concentration lower than an impurity concentration of the silicon carbide semiconductor substrate, the first semiconductor layer having a first surface and a second surface opposite to each other, the second surface of the first semiconductor layer facing the silicon carbide semiconductor substrate; a second semiconductor layer of the first conductivity type, provided on the first surface of the first semiconductor layer, the second semiconductor layer having a first surface and a second surface opposite to each other, the second surface of the second semiconductor layer facing the silicon carbide semiconductor substrate; a third semiconductor layer of the first conductivity type, provided on the first surface of the second semiconductor layer, and having an impurity concentration lower than the impurity concentration of the silicon carbide semiconductor substrate, the third semiconductor layer having a first surface and a second surface opposite to each other, the second surface of the third semiconductor layer facing the silicon carbide semiconductor substrate; a fourth semiconductor layer of a second conductivity type, provided on the first surface of the third semiconductor layer, the fourth semiconductor layer having a first surface and a second surface opposite to each other, the second surface of the fourth semiconductor layer facing the silicon carbide semiconductor substrate; a plurality of first semiconductor regions of the first conductivity type, selectively provided in the fourth semiconductor layer, at the first surface of the fourth semiconductor layer; a gate electrode provided via a gate insulating film in the fourth semiconductor layer, at least a portion of the gate electrode being positioned between the first semiconductor regions and the third semiconductor layer; a first electrode provided on the first surface of the fourth semiconductor layer and surfaces of the first semiconductor regions; and a second electrode provided on the second surface of the silicon carbide semiconductor substrate. Protons are introduced into the second semiconductor layer and have a concentration in a range from $1.0\times10^{13}/cm^3$ to $1.0\times10^{14}/cm^3$. The second semiconductor layer has an impurity concentration that is in a range from $1.0\times10^{18}/cm^3$ to $5.0\times10^{18}/cm^3$.

Objects, features, and advantages of the present invention are specifically set forth in or will become apparent from the following detailed description of the invention when read in conjunction with the accompanying drawings.

DETAILED DESCRIPTION OF THE INVENTION

Figure 10:
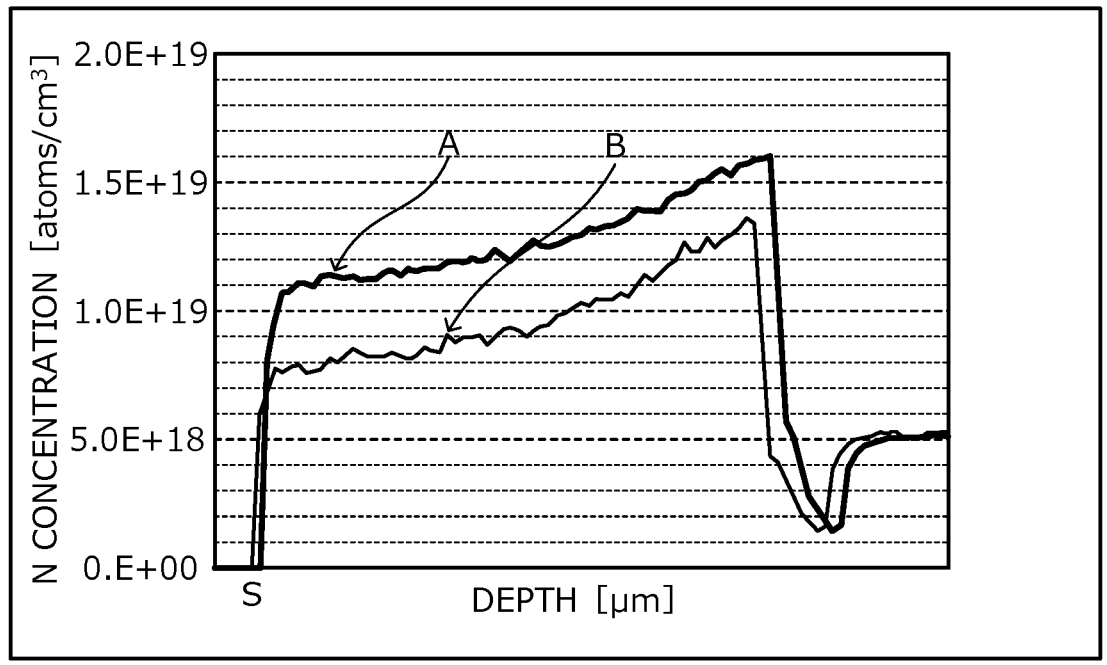
FIG. 10 is a graph depicting a concentration gradient of a high-concentration n-type buffer layer of the conventional silicon carbide semiconductor device.

First, problems associated with the conventional techniques are discussed. In raising the nitrogen concentration in the high-concentration n-type buffer layer 121, controlling the concentration by a process is difficult and variation in the impurity concentration of the nitrogen and film thickness occurs. FIG. 10 is a graph depicting a concentration gradient of the high-concentration n-type buffer layer of the conventional silicon carbide semiconductor device. In FIG. 10, a horizontal axis indicates depth from a surface S in units of µm. A vertical axis indicates nitrogen concentration in units of atoms/cm³. Further, curve A is an example for a semiconductor-wafer outer peripheral portion and curve B is an example for a semiconductor-wafer center portion.

As depicted in FIG. 10, in the semiconductor-wafer outer peripheral portion and the semiconductor-wafer center portion, the nitrogen concentration gradually increases in a depth direction (direction from the source electrode 112 to the back electrode 113) and the semiconductor-wafer outer peripheral portion has a nitrogen concentration higher than that of the semiconductor-wafer center portion. In this manner, when the nitrogen concentration in the high-concentration n-type buffer layer 121 is formed to be a high concentration, variation of the nitrogen concentration increases.

Further, when the nitrogen concentration of the high-concentration n-type buffer layer 121 is at least $1.2 \times 10^{19}/cm^3$, by making the nitrogen concentration in the high-concentration n-type buffer layer 121 a high concentration, double Shockley stacking faults (2SSFs) are easily generated, and device element Von (ON voltage) may degrade by energization. Furthermore, increasing the film thickness of the high-concentration n-type buffer layer 121 increases the time for epitaxial growth and manufacturing cost.

In this manner, when the nitrogen concentration of the high-concentration n-type buffer layer 121 is set to be high, manufacturing cost increases, concentration varies, and 2SSFs are generated, however, when the nitrogen concentration is low, a problem arises in that the hole concentration that reaches the substrate cannot be sufficiently reduced.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

Figure 1:
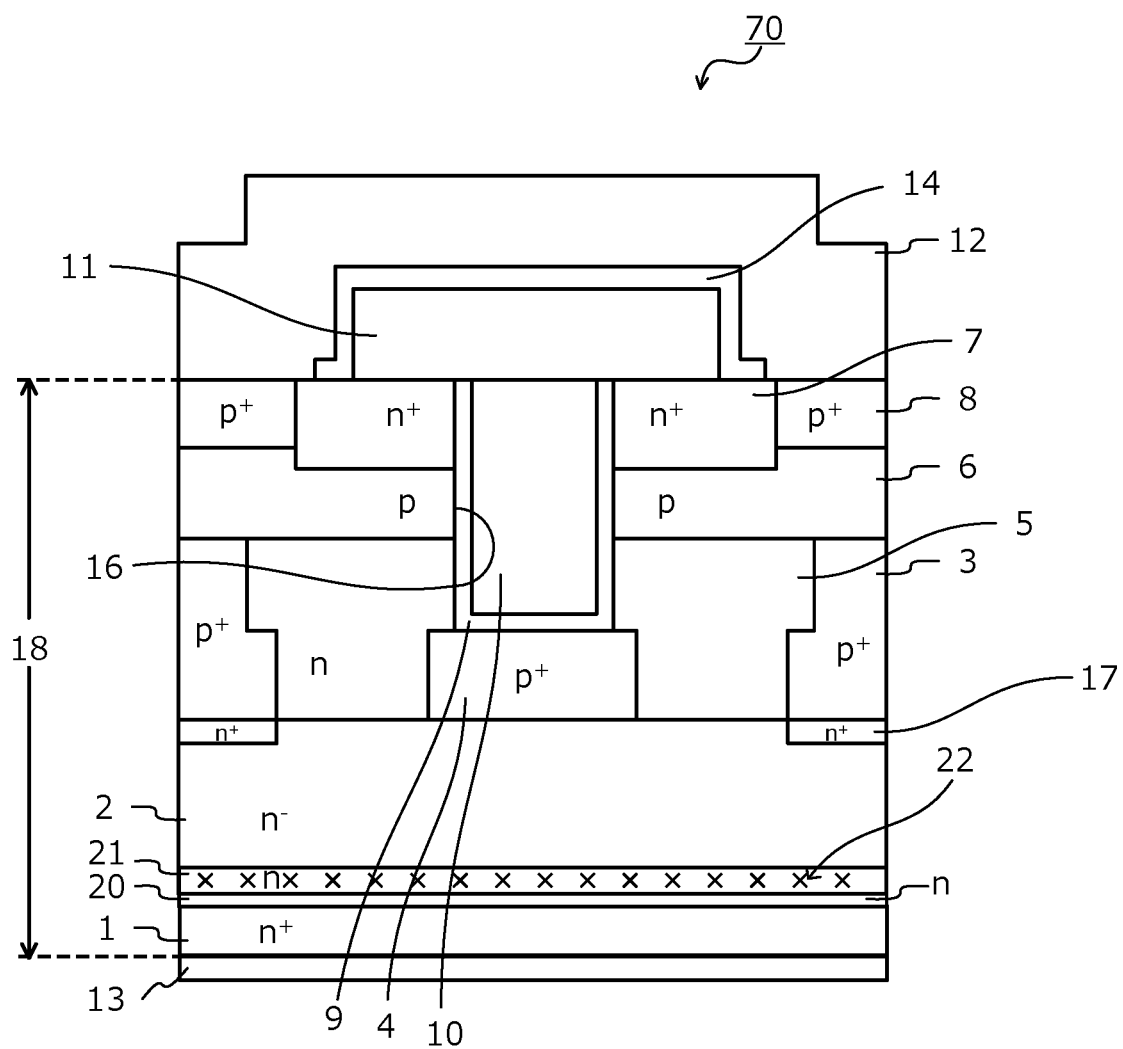
FIG. 1 is a cross-sectional view of a structure of a silicon carbide semiconductor device according to an embodiment.

A semiconductor device according to the present invention is configured using a wide bandgap semiconductor. In an embodiment, a silicon carbide semiconductor device fabricated (manufactured) using, for example, silicon carbide (SiC) as a wide bandgap semiconductor is described taking a trench-type MOSFET 70 as an example. FIG. 1 is a cross-sectional view of a structure of the silicon carbide semiconductor device according to the embodiment. In FIG. 1, only an active region through which a main current of the trench-type MOSFET 70 flows is depicted.

As depicted in FIG. 1, the silicon carbide semiconductor device according to the embodiment is configured using a silicon carbide semiconductor base 18 in which an n-type border layer (first semiconductor layer of a first conductivity type) 20, a high-concentration n-type buffer layer (second semiconductor layer of the first conductivity type) 21, an n⁻-type silicon carbide epitaxial layer (third semiconductor layer of the first conductivity type) 2, and a p-type base layer (fourth semiconductor layer of a second conductivity type) 6 are sequentially stacked on a first main surface (front surface), for example, a (0001) plane (Si-face) of an n⁺-type silicon carbide substrate (silicon carbide semiconductor substrate of the first conductivity type) 1.

In the n⁻-type silicon carbide epitaxial layer 2, at a first surface thereof opposite to a second surface thereof facing the n⁺-type silicon carbide substrate 1, n-type high-concentration regions 5 may be provided. The n-type high-concentration regions 5 are a high-concentration n-type drift layer having an impurity concentration lower than an impurity concentration of the n⁺-type silicon carbide substrate 1 and higher than an impurity concentration of the n⁻-type silicon carbide epitaxial layer 2.

The n-type border layer 20 has an impurity concentration lower than the impurity concentration of the n⁺-type silicon carbide substrate 1, in a range from $1.0 \times 10^{17}/cm^3$ to $1.0 \times 10^{18}/cm^3$, a film thickness in a range from 1 μm to 5 μm, and is doped with, for example, nitrogen (N). The n-type border layer 20 fixes origins of expansion of stacking faults and is provided to prevent crystal defects of the n⁺-type silicon carbide substrate 1 from being transmitted to the n⁻-type silicon carbide epitaxial layer 2.

The high-concentration n-type buffer layer 21, for example, is a highly doped layer in which nitrogen is doped at a high concentration. The high-concentration n-type buffer layer 21 is irradiated with protons (P), whereby formed protons 22 are introduced. The protons 22 migrate as lifetime killers of holes, encourage recombination of the holes from the n⁻-type silicon carbide epitaxial layer 2, control the hole concentration reaching the n⁺-type silicon carbide substrate 1, and suppress the generation of stacking faults and expansion of the area thereof. Herein, while an example in which the protons 22 are introduced is depicted, instead of the protons 22, similar effects may be obtained with an introduction of helium (He).

Therefore, the high-concentration n-type buffer layer 21 has an impurity concentration lower than conventionally and even when the film thickness is made thinner, holes may be recombined to an extent similar to that of the conventional high-concentration n-type buffer layer 121. Therefore, manufacturing cost of the high-concentration n-type buffer layer 21 is reduced, and the expansion of 2SSFs of the high-concentration n-type buffer layer 21 may be prevented without variation of the impurity concentration.

An impurity concentration of the high-concentration n-type buffer layer 21 is in a range from $1.0 \times 10^{18}/cm^3$ to $5.0 \times 10^{18}/cm^3$, a range of concentration easily controlled by a process. Further, the impurity concentration is a concentration under which double Shockley stacking faults (2SSFs) are not easily generated, and by the high-concentration n-type buffer layer 21, expansion of 1SSFs from the substrate and expansion of 2SSFs due to raising the concentration of nitrogen in the high-concentration n-type buffer layer 21 may both be prevented. Further, the impurity concentration of the high-concentration n-type buffer layer 21 is reduced, whereby the impurity concentration of nitrogen and/or film thickness may be made uniform. For example, a difference of the impurity concentration at a surface of the high-concentration n-type buffer layer 21 (surface thereof in contact with the n⁻-type silicon carbide epitaxial layer 2) and the impurity concentration at a back surface may be within two-fold thereof. For example, in an instance in which the impurity concentration at the surface is $1.0 \times 10^{18}/cm^3$, the impurity concentration at the back surface is $2.0 \times 10^{18}/cm^3$.

Further, an impurity in the high-concentration n-type buffer layer 21 may also migrate as a lifetime killer of holes and therefore, as compared to introducing the protons 22 into the n⁻-type silicon carbide epitaxial layer 2 without providing the high-concentration n-type buffer layer 2, the concentration of the protons 22 may be kept low. As a result, an irradiation amount of the protons may be reduced and therefore, damage to a gate insulating film 9 by the proton irradiation is reduced and decrease of a threshold value (Vth) may be suppressed.

Figure 2:
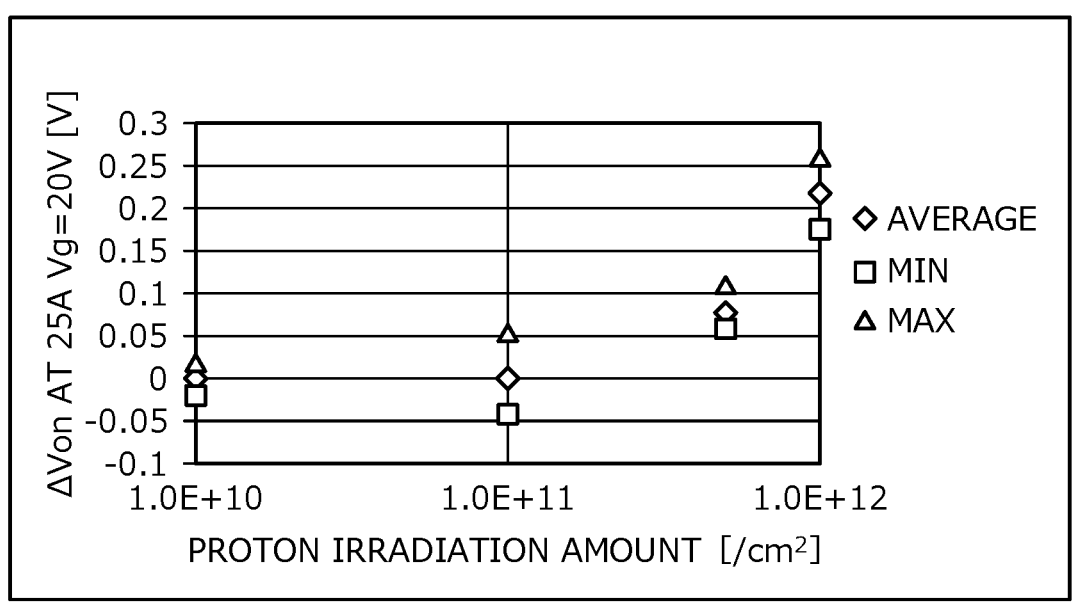
FIG. 2 is a graph showing a relationship between proton irradiation amount and Von change amount in the silicon carbide semiconductor device according to the embodiment.

Further, a concentration of the protons 22 is in a range from $1.0 \times 10^{13}/cm^3$ to $1.0 \times 10^{14}/cm^3$. FIG. 2 is a graph showing a relationship between proton irradiation amount and Von change amount in the silicon carbide semiconductor device according to the embodiment. In FIG. 2, a horizontal axis indicates proton irradiation amount (dose amount) in units of /cm$^2$. A vertical axis indicates an amount of change in Von ΔVon when a test is performed under a state in which voltage 20V is applied to the gate and current between the source and drain is 25 A, ΔVon is indicated in units of V. In FIG. 2, minimum values (min), maximum values (max), and average values (average) of ΔVon obtained by multiple tests are shown.

As depicted in FIG. 2, when the proton irradiation amount (dose amount) exceeds $1.0 \times 10^{11}$/cm$^2$, ΔVon increases. A dose amount of $1.0 \times 10^{11}$/cm$^2$ corresponds to a peak concentration $1.0 \times 10^{14}$/cm$^3$ of the protons 22. Therefore, in the embodiment, a peak concentration of the protons 22 may be preferably a concentration in a range from $1.0 \times 10^{13}$/cm$^3$ to $1.0 \times 10^{14}$/cm$^3$.

Further, origins of expansion of the stacking faults are present in the n-type border layer 20 and therefore, the film thickness of the high-concentration n-type buffer layer 21 may be preferably adjusted so that the hole concentration at an interface between the n-type border layer 20 and the high-concentration n-type buffer layer 21 on the n-type border layer 20 becomes at most $10 \times 10^{15}$/cm$^3$; for example, the film thickness of the high-concentration n-type buffer layer 21 is in a range from 1 μm to 5 μm.

Further, a peak value of the concentration of the protons 22 in the high-concentration n-type buffer layer 21 may preferably occur about 5 μm from the interface between the n-type border layer 20 and the high-concentration n-type buffer layer 21, toward the n$^-$-type silicon carbide epitaxial layer 2. A half width of the concentration of the protons 22 (region in which the concentration is at least half of the peak value) may be preferably in a range from 5 μm to 10 μm. As a result, the protons 22 are introduced centered around the high-concentration n-type buffer layer 21 and therefore, increases of the resistance of the n$^-$-type silicon carbide epitaxial layer 2 that is a drift layer may be suppressed.

For example, in an instance of energization under conditions of a current density of 1100 A/cm$^3$ and a temperature of 175 degrees C., the peak concentration of the protons 22 is $1.0 \times 10^{14}$/cm$^3$, and provided a layer in which the lifetime killers due to the protons 22 is decreased (for example, a region in which the concentration of the protons 22 is at least half of the peak value) is at least 9 μm, even when the nitrogen concentration of the high-concentration n-type buffer layer 21 is $1.0 \times 10^{18}$/cm$^3$ and the film thickness is 1 μm, the hole concentration at the interface between the n-type border layer 20 and the high-concentration n-type buffer layer 21 on the n-type border layer 20 may be set to be at most $1.0 \times 10^{15}$/cm$^3$. In this manner, by making the high-concentration n-type buffer layer 21 thinner than conventionally, the time of epitaxial growth is shorter and manufacturing cost may be reduced.

On a second main surface of the n$^+$-type silicon carbide substrate 1 (back surface, i.e., back surface of the silicon carbide semiconductor base 18), a back electrode 13 that is a drain electrode is provided. On a surface of the back electrode 13, a drain electrode pad (not depicted) is provided.

In the silicon carbide semiconductor base 18 at a first main surface thereof (surface having the p-type base layer 6), a trench structure is formed. In particular, from a first surface of the p-type base layer 6 opposite to a second surface thereof facing the n$^+$-type silicon carbide substrate 1 (the first main surface of the silicon carbide semiconductor base 18), trenches 16 penetrate through the p-type base layer 6 and reach the n-type high-concentration regions 5 (in an instance in which the n-type high-concentration regions 5 are omitted, the n$^-$-type silicon carbide epitaxial layer 2, hereinafter simply "(2)"). Along inner walls of the trenches 16, the gate insulating film 9 is formed on bottoms and sidewalls of the trenches 16, and on the gate insulating film 9 in the trenches 16, gate electrodes 10 are formed, respectively. The gate electrodes 10 are insulated from the n-type high-concentration regions 5(2) and the p-type base layer 6 by the gate insulating film 9. A portion of each of the gate electrodes 10 may protrude from tops of the trenches 16 (portion facing a later-described source electrode 12), toward the source electrode 12. Further, the gate insulating film 9 may be preferably formed on an m-plane. For example, in an instance in which the trench structure is formed, the sidewalls of the trenches 16 may be preferably m-planes.

In the n-type high-concentration regions 5(2), at first surfaces thereof (the first main surface of the silicon carbide semiconductor base 18) opposite to second surfaces thereof facing the n$^+$-type silicon carbide substrate 1, first p$^+$-type base regions 3 are respectively provided between the trenches 16. Further, in the n-type high-concentration regions 5(2), second p$^+$-type base regions 4 respectively in contact with the bottoms of the trenches 16 are provided. The second p$^+$-type base regions 4 are provided at positions respectively facing the trenches 16 in the depth direction (direction from the source electrode 12 to the back electrode 13 (drain electrode)). A width of each of the second p$^+$-type base regions 4 is equal to or wider than a width of each of the trenches 16. The bottoms of the trenches 16 may reach the second p$^+$-type base regions 4 or may be positioned in the n-type high-concentration regions 5(2) between the p-type base layer 6 and the second p$^+$-type base regions 4, respectively.

Further, in the n$^-$-type silicon carbide epitaxial layer 2, at positions deeper than are the first p$^+$-type base regions 3 respectively between the trenches 16, n$^+$-type regions 17 having a peak impurity concentration higher than that of the n-type high-concentration regions 5(2) are provided. A deep position is a position closer to the back electrode 13 than are the first p$^+$-type base regions 3.

In the p-type base layer 6, in the silicon carbide semiconductor base 18 at the first main surface thereof, n$^+$-type source regions (first semiconductor regions of the first conductivity type) 7 are selectively provided. Further, p$^+$-type contact regions 8 may be selectively provided. Further, the n$^+$-type source regions 7 and the p$^+$-type contact regions 8 are in contact with one another.

An interlayer insulating film 11 is provided in an entire area of the first main surface of the silicon carbide semiconductor base 18 so as to cover the gate electrodes 10 embedded in the trenches 16. The source electrode 12 is in contact with the n$^+$-type source regions 7 and the p-type base layer 6 via contact holes opened in the interlayer insulating film 11. Further, in an instance in which the p$^+$-type contact regions 8 are provided, the source electrode 12 is in contact with the n$^+$-type source regions 7 and the p$^+$-type contact regions 8. The source electrode 12 is electrically insulated from the gate electrodes 10 by the interlayer insulating film 11. On the source electrode 12, a source electrode pad (not depicted) is provided. Between the source electrode 12 and the interlayer insulating film 11, for example, a barrier metal 14 that prevents diffusion of metal atoms from the source electrode 12 to the gate electrodes 10 may be provided.

Next, a method of manufacturing the silicon carbide semiconductor device according to the embodiment is described. FIGS. 3, 4, 5, 6, 7, and 8 are cross-sectional views depicting states of the silicon carbide semiconductor device according to the embodiment during manufacture.

First, the n$^+$-type silicon carbide substrate 1 containing silicon carbide of an n-type is prepared. The n$^+$-type silicon carbide substrate 1, for example, is about $5.0\times10^{18}$/cm$^3$. Further, on the first main surface of the n$^+$-type silicon carbide substrate 1, the n-type border layer 20 containing silicon carbide, for example, is epitaxially grown to have a thickness of about 5 μm while an n-type impurity, for example, nitrogen atoms (N) is doped. An impurity concentration of the n-type border layer 20 may be set to be, for example, about $1.0\times10^{18}$/cm$^3$.

Next, on the surface of the n-type border layer 20, the high-concentration n-type buffer layer 21 containing silicon carbide, for example, is epitaxially grown to have a thickness in a range from 1 μm to 5 μm while an n-type impurity, for example, nitrogen atoms (N) is doped. The impurity concentration of the high-concentration n-type buffer layer 21, for example, may be set to be in a range from $1.0\times10^{18}$/cm$^3$ to $5.0\times10^{18}$/cm$^3$.

Figure 3:
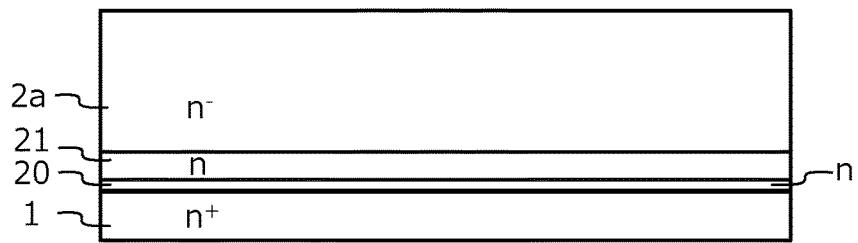
FIG. 3 is a cross-sectional view depicting a state of the silicon carbide semiconductor device according to the embodiment during manufacture.

Next, on a surface of the high-concentration n-type buffer layer 21, a lower n$^-$-type silicon carbide epitaxial layer 2a, for example, is epitaxially grown to have a thickness of about 30 μm while an n-type impurity, for example, nitrogen atoms (N) is doped. The state up to here is depicted in FIG. 3.

Next, on a surface of the lower n$^-$-type silicon carbide epitaxial layer 2a, by a photolithographic technique, a non-depicted mask having predetermined openings is formed, for example, using an oxide film. Then, by an ion implantation method using the oxide film as a mask, an n-type impurity, for example, nitrogen atoms may be ion implanted. As a result, in the lower n$^-$-type silicon carbide epitaxial layer 2a, the n$^+$-type regions 17 are formed.

Next, the ion implantation mask used during the ion implantation for forming the n$^+$-type regions 17 is removed. Next, by a photolithographic technique, an ion implantation mask having predetermined openings is formed, for example, using an oxide film. Then, a p-type impurity such as aluminum is implanted in the openings of the oxide film, whereby the second p$^+$-type base regions 4 and lower first p$^+$-type base regions 3a of a depth of about 0.5 μm are formed. In an instance in which the n$^+$-type regions 17 are formed, on first surfaces of the n$^+$-type regions 17 opposite to second surfaces thereof facing the n$^+$-type silicon carbide substrate 1, the lower first p$^+$-type base regions 3a are formed so as to respectively overlay the n$^+$-type regions 17.

Figure 4:
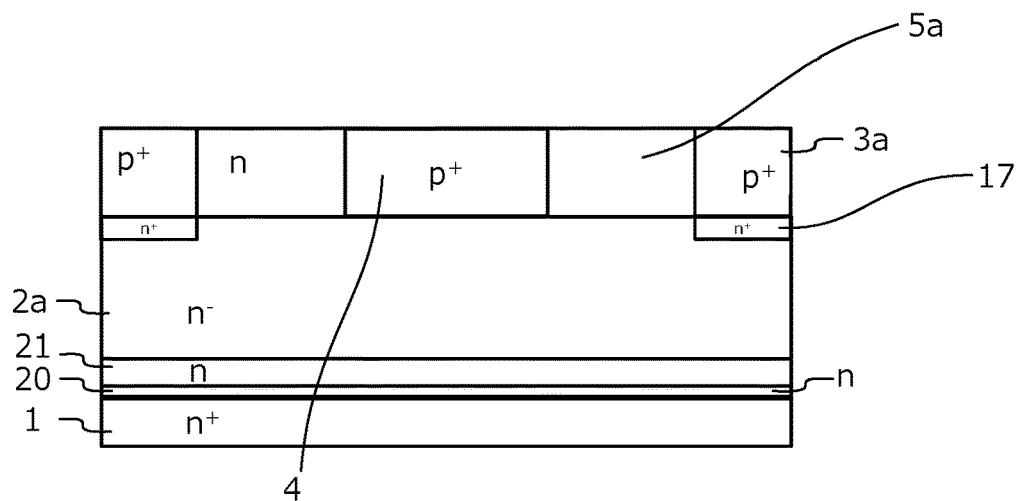
FIG. 4 is a cross-sectional view depicting a state of the silicon carbide semiconductor device according to the embodiment during manufacture.

Next, the ion implantation mask may be partially removed, an n-type impurity such as nitrogen may be ion implanted in the openings, whereby lower n-type high-concentration regions 5a of a depth of, for example, about 0.5 μm may be formed in a portion of surface regions of the lower n$^-$-type silicon carbide epitaxial layer 2a. An impurity concentration of the lower n-type high-concentration regions 5a may be set to, for example, about $1\times10^{17}$/cm$^3$. The state up to here is depicted in FIG. 4.

Next, on a surface of the lower n$^-$-type silicon carbide epitaxial layer 2a, an upper n$^-$-type silicon carbide epitaxial layer 2b doped with an n-type impurity such as nitrogen is formed having a thickness of about 0.5 μm. An impurity concentration of the upper n$^-$-type silicon carbide epitaxial layer 2b is set to be about $3\times10^{15}$/cm$^3$. Hereinafter, the lower n$^-$-type silicon carbide epitaxial layer 2a and the upper n$^-$-type silicon carbide epitaxial layer 2b combined are the n$^-$-type silicon carbide epitaxial layer 2.

Next, on a surface of the upper n$^-$-type silicon carbide epitaxial layer 2b, an ion implantation mask having predetermined openings is formed by photolithography using, for example, an oxide film. Then, a p-type impurity such as aluminum is implanted in the openings of the oxide film, thereby forming upper first p$^+$-type base regions 3b of a depth of about 0.5 μm, the upper first p$^+$-type base regions 3b being formed so as to overlay the lower first type base regions 3a. The upper first p$^+$-type base regions 3b and the lower first p$^+$-type base regions 3a form continuous regions to become the first p$^+$-type base regions 3. An impurity concentration of the upper first p$^+$-type base regions 3b is set to be, for example, about $5\times10^{18}$/cm$^3$.

Figure 5:
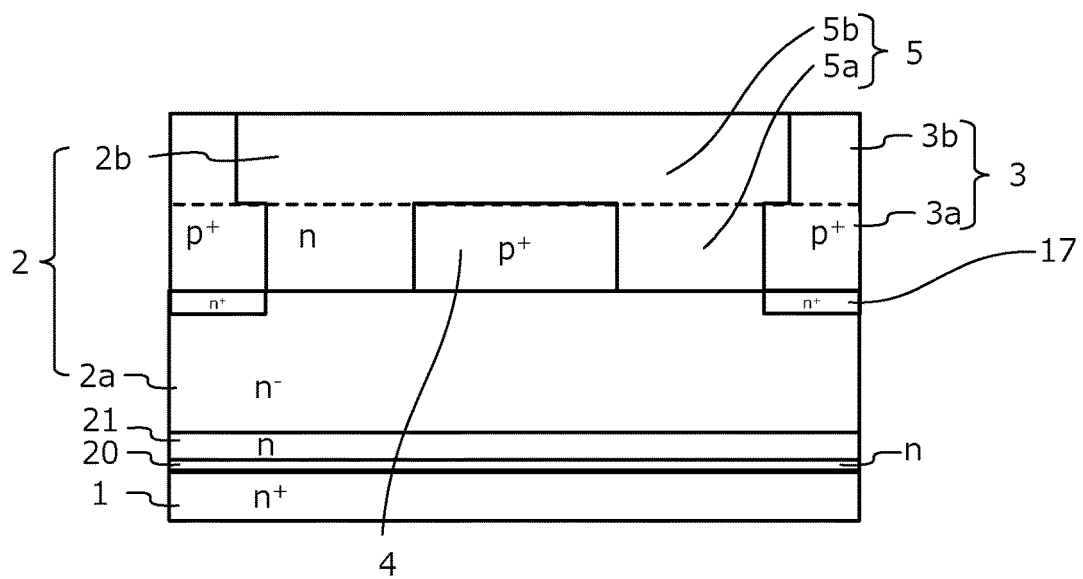
FIG. 5 is a cross-sectional view depicting a state of the silicon carbide semiconductor device according to the embodiment during manufacture.

Next, the ion plantation mask may be partially removed, an n-type impurity such as nitrogen may be ion implanted in the openings, whereby upper n-type high-concentration regions 5b of a thickness of, for example, about 0.5 μm may be formed in a portion of surface regions of the n$^-$-type silicon carbide epitaxial layer 2. An impurity concentration of the upper n-type high-concentration regions 5b may be set to, for example, about $1\times10^{17}$/cm$^3$. The upper n-type high-concentration regions 5b and the lower n-type high-concentration regions 5a are formed so as to partially be in contact with one another, thereby forming the n-type high-concentration regions 5. Nonetheless, the n-type high-concentration regions 5 may be formed in an entire area of the substrate or may be omitted. The state up to here is depicted in FIG. 5.

Next, on a surface of the n$^-$-type silicon carbide epitaxial layer 2, the p-type base layer 6 is formed having a thickness of about 1.1 μm by epitaxial growth. An impurity concentration of the p-type base layer 6 is set to be about $4\times10^{17}$/cm$^3$. After the p-type base layer 6 is formed by epitaxial growth, a p-type impurity such as aluminum may be further ion implanted in the p-type base layer 6.

Next, in the silicon carbide semiconductor base 18 at the first main surface thereof (surface of the p-type base layer 6), predetermined regions configuring the MOS gates are formed. In particular, on a surface of the p-type base layer 6, an ion implantation mask having predetermined openings is formed by photolithography using, for example, an oxide film. In the openings, an n-type impurity such as nitrogen (N), phosphorus (P), etc. is ion implanted, whereby the n$^+$-type source regions 7 are formed in portions of the p-type base layer 6 at a surface thereof. Next, the ion implantation mask used in forming the n$^+$-type source regions 7 is removed and by a similar method, an ion implantation mask having predetermined openings may be formed, a p-type impurity such as boron may be ion implanted in portions of a surface of the p-type base layer 6, whereby the p$^+$-type contact regions 8 may be formed. An impurity concentration of the p$^+$-type contact regions 8 is set to be higher than the impurity concentration of the p-type base layer 6.

Figure 6:
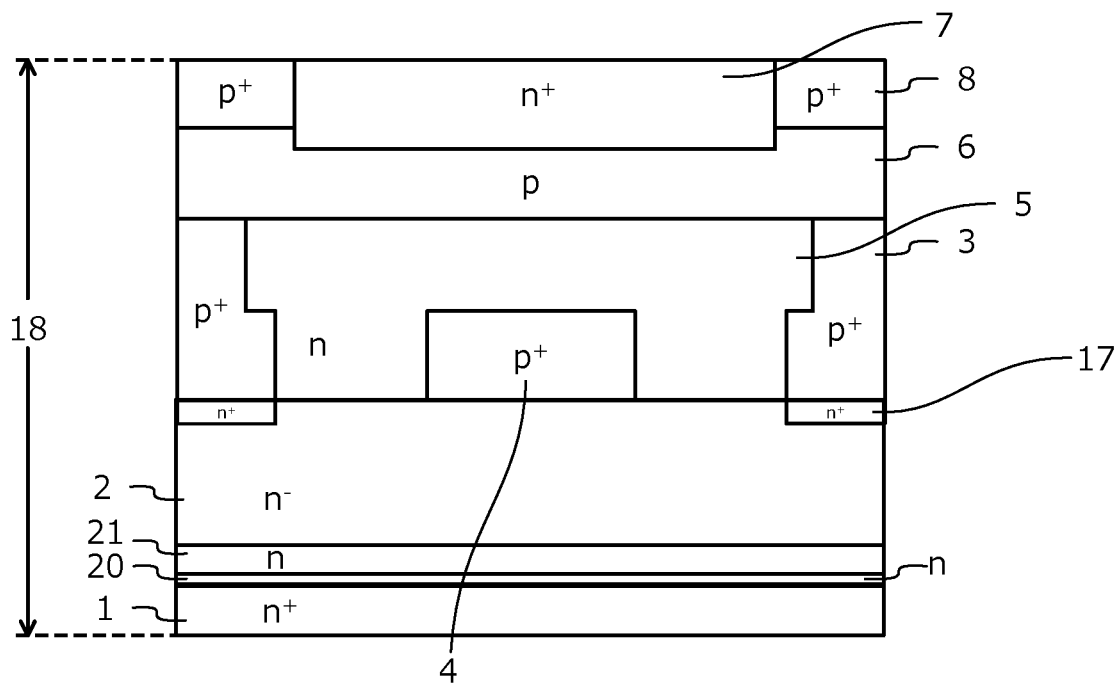
FIG. 6 is a cross-sectional view depicting a state of the silicon carbide semiconductor device according to the embodiment during manufacture.

Next, a heat treatment (activation annealing) for activating all regions formed by ion implantation is performed. For example, a heat treatment (annealing) is performed under an inert gas atmosphere of a temperature of about 1700 degrees C., whereby an activation process for the first p$^+$-type base regions 3, the second p$^+$-type base regions 4, the n$^+$-type source regions 7, the p$^+$-type contact regions 8, and the n$^+$-type regions 17 is implemented. As described above, all of the ion implanted regions may be collectively activated by a single session of the heat treatment or may be activated by performing the heat treatment each time ion implantation is performed. The state up to here is depicted in FIG. 6.

Next, on the surface of the p-type base layer 6, a trench formation mask having predetermined openings is formed by photolithography, for example, using an oxide film. Next, by dry etching, the trenches 16 that penetrate the p-type base layer 6 and reach the n-type high-concentration regions 5(2) are formed. The bottoms of the trenches 16 may reach the second $p^+$-type base regions 4 formed in the n-type high-concentration regions 5(2). Next, the trench formation mask is removed.

Next, the gate insulating film 9 is formed along surfaces of the $n^+$-type source regions 7, surfaces of the $p^+$-type contact regions 8, and the bottoms and the sidewalls of the trenches 16. The gate insulating film 9 may be formed by a heat treatment of about 1000 degrees C. under an oxygen atmosphere. Further, the gate insulating film 9 may be formed by a deposition method by a chemical reaction such as that for high temperature oxide (HTO).

Figure 7:
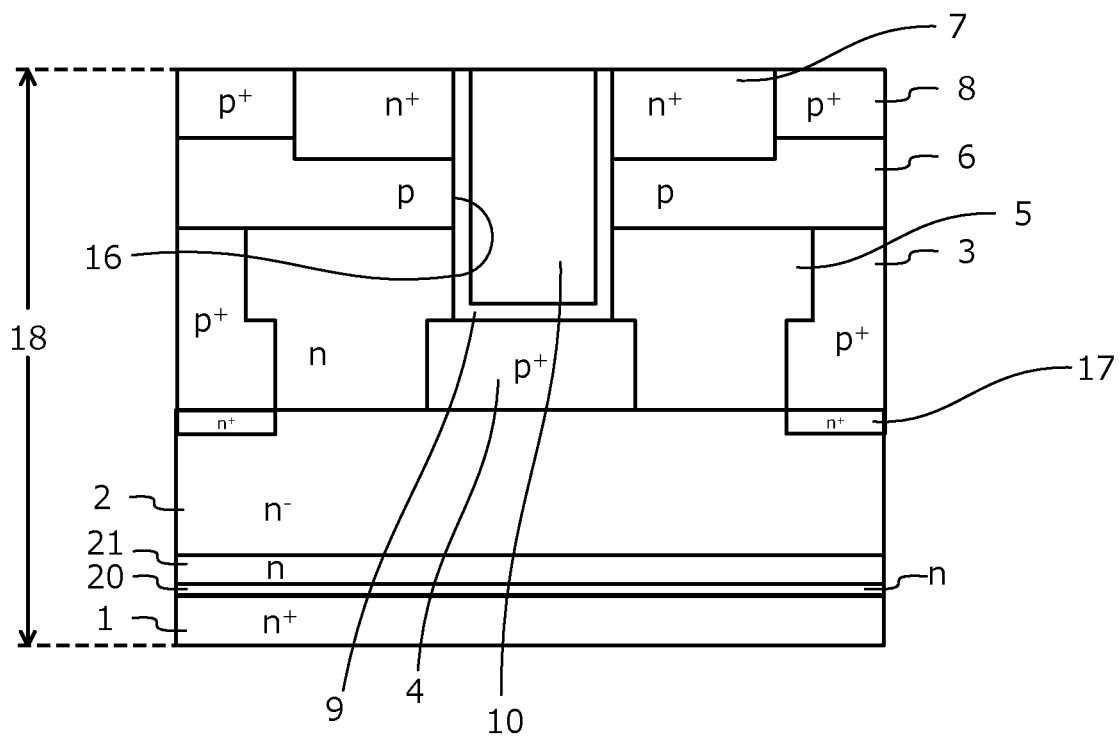
FIG. 7 is a cross-sectional view depicting a state of the silicon carbide semiconductor device according to the embodiment during manufacture.

Next, on the gate insulating film 9, a polycrystalline silicon layer doped with, for example, phosphorus atoms is provided. The polycrystalline silicon layer may be formed so as to be embedded in the trenches 16. The polycrystalline silicon layer is patterned by photolithography and is left in the trenches 16, whereby the gate electrodes 10 are formed. The state up to here is depicted in FIG. 7.

Next, a particle beam irradiation 23 is performed to the silicon carbide semiconductor base, from the first main surface thereof (surface having the $p^+$-type base layer 6). The particle beam irradiation 23 irradiates protons. Alternatively, instead of protons, helium may be irradiated. The particle beam irradiation 23 is performed so that the protons 22 are introduced into the high-concentration n-type buffer layer 21. The protons 22 disappear with a temperature of at least 500 degrees C. and therefore, the particle beam irradiation 23 is performed after the activation annealing is performed. Here, while the particle beam irradiation 23 is performed after formation of the gate electrodes 10, annealing that converts nickel into a nickel silicide formed on the surface of the silicon carbide semiconductor base in the contact holes of the interlayer insulating film 11 is assumed to be about 1000 degrees C. and therefore, the particle beam irradiation 23 suffices to be after the annealing that forms the nickel silicide is performed.

Figure 8:
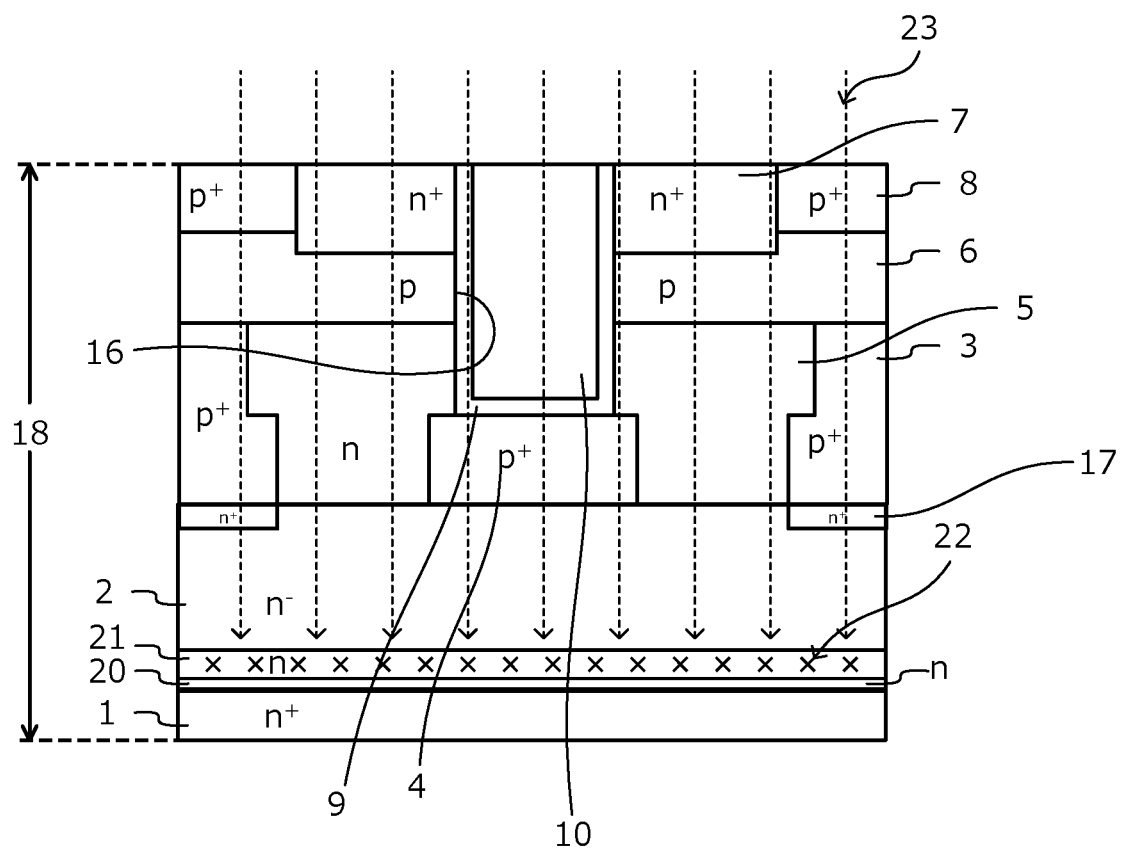
FIG. 8 is a cross-sectional view depicting a state of the silicon carbide semiconductor device according to the embodiment during manufacture.
Figure 9:
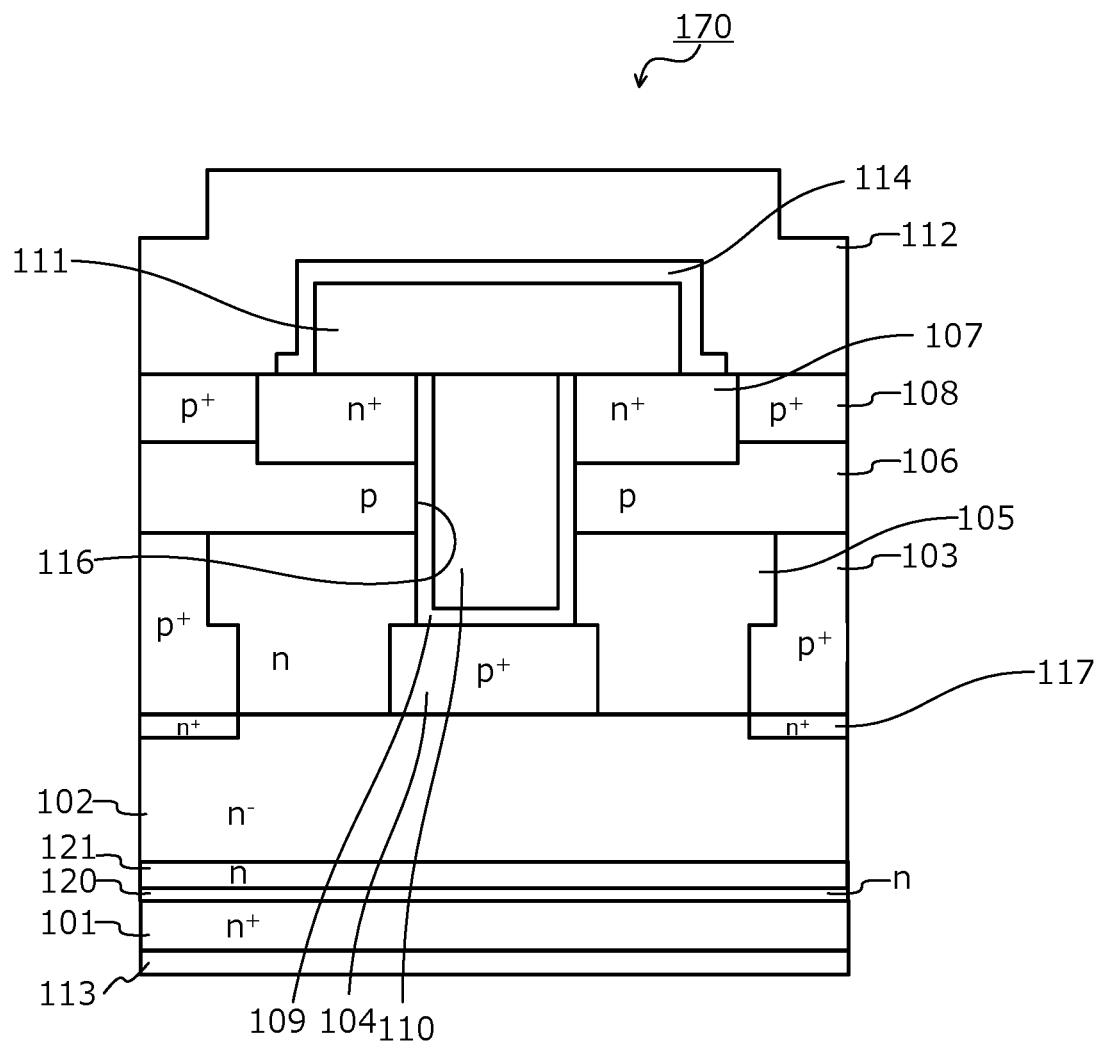
FIG. 9 is a cross-sectional view of a trench gate structure of a conventional silicon carbide semiconductor device.

Further, the particle beam irradiation 23 may be performed from the back surface of the silicon carbide semiconductor base. In this instance, effects of the particle beam irradiation 23 on the gate electrodes 10 may be reduced. Nonetheless, with the particle beam irradiation 23 from the back surface, adjustment of the peak position of the concentration of the protons is difficult because the film thickness of the $n^+$-type silicon carbide substrate 1 is thick and furthermore, the half width of the concentration of the protons 22 of the high-concentration n-type buffer layer 21 is wide and therefore, the particle beam irradiation 23 may be preferably performed from the first main surface of the silicon carbide semiconductor base. The state up to here is depicted in FIG. 8.

Next, for example, a phosphate glass is deposited so as to cover the gate insulating film 9 and the gate electrodes 10 and have a thickness of about 1 µm, whereby the interlayer insulating film 11 is formed. Next, the barrier metal 14 containing titanium (Ti) or titanium nitride (TiN) may be formed so as to cover the interlayer insulating film 11. The interlayer insulating film 11 and the gate insulating film 9 are patterned by photolithography, whereby contact holes that expose the $n^+$-type source regions 7 and the $p^+$-type contact regions 8 are formed. Thereafter, a heat treatment (reflow) is performed, thereby planarizing the interlayer insulating film 11.

Next, the interlayer insulating film 11 is selectively removed and on a surface of the silicon carbide semiconductor base 18, a film containing nickel (Ni) or Ti is formed. Next, the surface is protected and on the back surface of the $n^+$-type silicon carbide substrate 1, a film containing Ni or Ti is formed, Next, a heat treatment of a temperature of about 1000 degrees C. is performed, whereby an ohmic electrode is formed on the surface of the silicon carbide semiconductor base 18 and on the back surface of the $n^+$-type silicon carbide substrate 1.

Next, so as to be in contact with ohmic electrode portions formed in the contact holes and on the interlayer insulating film 11, a conductive film that forms the source electrode 12 is provided, and the $n^+$-type source regions 7 and the $p^+$-type contact regions 8 are brought into contact with the source electrode 12.

Subsequently, on the second main surface of the $n^+$-type silicon carbide substrate 1, the back electrode 13 is formed by, for example, a nickel (Ni) film. Thereafter, for example, a heat treatment is performed at a temperature of about 970 degrees C., whereby the $n^+$-type silicon carbide substrate 1 and the back electrode 13 are in ohmic contact with each other.

Next, for example, by a sputtering method, on the source electrode 12 on the front surface of the silicon carbide semiconductor base 18 and in the openings of the interlayer insulating film 11, an electrode pad that forms the source electrode pad (not depicted) is deposited. A portion of the electrode pad on the interlayer insulating film 11 may have a thickness of, for example, 5 µm. The electrode pad, for example, may be formed by aluminum containing silicon at a rate of 1% (Al—Si). Next, the source electrode pad is selectively removed.

Next, on a surface of the back electrode 13, for example, titanium (Ti), nickel (Ni), and gold (Au) are sequentially deposited as the drain electrode pad (not depicted). In this manner, the silicon carbide semiconductor device depicted in FIG. 1 is completed.

As described above, according to the embodiment, protons are introduced into a high-concentration n-type buffer layer. The protons act as hole lifetime killers and therefore, the high-concentration n-type buffer layer has a concentration lower than conventionally and even when the film thickness is reduced, the holes may be recombined to a same extent as with the conventional high-concentration n-type buffer layer. Therefore, manufacturing cost of the high-concentration n-type buffer layer is reduced, and expansion of 2SSFs of the high-concentration n-type buffer layer may be prevented without variation of the concentration.

Further, the impurity in the high-concentration n-type buffer layer may also act as a hole lifetime killer and therefore, the concentration of the protons may be kept low as compared to introducing protons in the $n^-$-type silicon carbide epitaxial layer without providing the high-concentration n-type buffer layer. As a result, an irradiation amount of the protons may be reduced and therefore, damage of the gate insulating film due to the proton irradiation decreases and decrease of the threshold value (Vth) may be suppressed.

In the foregoing, the present invention may be variously changed within a range not departing from the spirit of the invention and in the embodiments, for example, dimensions, impurity concentrations, etc. of parts are variously set according to necessary specifications. Further, in the embodiments described above, while a trench-gate-type vertical MOSFET is described as an example, application is further possible to a PiN diode, an insulated gate bipolar transistor (IGBT), etc. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, protons are introduced into the high-concentration n-type buffer layer (second semiconductor layer of the first conductivity type). The protons act as hole lifetime killers and therefore, the high-concentration n-type buffer layer has a lower concentration than conventionally and even when the film thickness is reduced, holes may be recombined to a same extent as with the conventional high-concentration n-type buffer layer. Therefore, manufacturing cost of the high-concentration n-type buffer layer is reduced, and expansion of 2SSFs of the high-concentration n-type buffer layer may be prevented without variation of the concentration.

Further, the impurity in the high-concentration n-type buffer layer may also act as a hole lifetime killer and therefore, the concentration of protons may be kept low as compared to introducing protons in the n$^-$-type silicon carbide epitaxial layer (third semiconductor layer of the first conductivity type) without providing the high-concentration n-type buffer layer. As a result, the irradiation amount of the protons may be reduced and therefore, damage of the gate insulating film due to the proton irradiation decreases, and decrease of the threshold value (Vth) may be suppressed.

The silicon carbide semiconductor device and the method of manufacturing a silicon carbide semiconductor device according to the present invention achieve an effect in that even when the concentration of the high-concentration n-type buffer layer is decreased, the hole concentration that reaches the substrate may be sufficiently reduced.

As described above, the silicon carbide semiconductor device and the method of manufacturing a silicon carbide semiconductor device according to the present invention are useful for power semiconductor devices used in power converting equipment such as inverters, power supply devices of various types of industrial machines, ignitors for automobiles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a silicon carbide semiconductor substrate of a first conductivity type, having a first surface and a second surface opposite to each other;
a first semiconductor layer of the first conductivity type, provided on the first surface of the silicon carbide semiconductor substrate, and having an impurity concentration lower than an impurity concentration of the silicon carbide semiconductor substrate, the first semiconductor layer having a first surface and a second surface opposite to each other, the second surface of the first semiconductor layer facing the silicon carbide semiconductor substrate;
a second semiconductor layer of the first conductivity type, provided on the first surface of the first semiconductor layer, the second semiconductor layer having a first surface and a second surface opposite to each other, the second surface of the second semiconductor layer facing the silicon carbide semiconductor substrate;
a third semiconductor layer of the first conductivity type, provided on the first surface of the second semiconductor layer, and having an impurity concentration lower than the impurity concentration of the silicon carbide semiconductor substrate, the third semiconductor layer having a first surface and a second surface opposite to each other, the second surface of the third semiconductor layer facing the silicon carbide semiconductor substrate;
a fourth semiconductor layer of a second conductivity type, provided on the first surface of the third semiconductor layer, the fourth semiconductor layer having a first surface and a second surface opposite to each other, the second surface of the fourth semiconductor layer facing the silicon carbide semiconductor substrate;
a plurality of first semiconductor regions of the first conductivity type, selectively provided in the fourth semiconductor layer, at the first surface of the fourth semiconductor layer;
a gate electrode provided via a gate insulating film in the fourth semiconductor layer, at least a portion of the gate electrode being positioned between the plurality of first semiconductor regions and the third semiconductor layer;
a first electrode provided on the first surface of the fourth semiconductor layer and surfaces of the plurality of first semiconductor regions; and
a second electrode provided on the second surface of the silicon carbide semiconductor substrate, wherein
protons are introduced into the second semiconductor layer and have a concentration in a range from $1.0 \times 10^{13}/cm^3$ to $1.0 \times 10^{14}/cm^3$, and
the second semiconductor layer has an impurity concentration that is in a range from $1.0 \times 10^{18}/cm^3$ to $5.0 \times 10^{18}/cm^3$.

2. The silicon carbide semiconductor device according to claim 1, wherein
the second semiconductor layer has a film thickness in a range from 1 μm to 5 μm.

3. The silicon carbide semiconductor device according to claim 2, wherein
a distance between where a peak of the concentration of the protons forms in the second semiconductor layer and an interface between the first semiconductor layer and the second semiconductor layer is no more than 5 μm.

4. The silicon carbide semiconductor device according to claim 1, wherein
a half width of the concentration of the protons is in a range from 5 μm to 10 μm.

5. The silicon carbide semiconductor device according to claim 1, wherein
the protons are introduced by irradiating the protons or helium.

6. A method of manufacturing the silicon carbide semiconductor device according to claim 1, the method comprising:
preparing the silicon carbide semiconductor substrate;
forming the first semiconductor layer on the first surface of the silicon carbide semiconductor substrate;
forming the second semiconductor layer on the first surface of the first semiconductor layer;
forming the third semiconductor layer on the first surface of the second semiconductor layer;
forming the fourth semiconductor layer on the first surface of the third semiconductor layer;

selectively forming the plurality of first semiconductor regions in the fourth semiconductor layer, at the first surface of the fourth semiconductor layer;

forming the gate electrode via the gate insulating film in the fourth semiconductor layer;

irradiating the protons into the second semiconductor layer, such that the protons have the concentration in the range from $1.0\times10^{13}/cm^3$ to $1.0\times10^{14}/cm^3$;

forming the first electrode on the first surface of the fourth semiconductor layer and the surfaces of the plurality of first semiconductor regions; and forming the second electrode on the second surface of the silicon carbide semiconductor substrate.

7. The method according to claim 6, wherein
the protons are irradiated from a side of the first electrode of the silicon carbide semiconductor device.

8. The method according to claim 6, further comprising
performing a heat treatment to the plurality of first semiconductor regions after selectively forming the plurality of first semiconductor regions, wherein
the protons are irradiated subsequently to the heat treatment.

* * * * *